United States Patent [19]
Russell et al.

[11] Patent Number: 6,093,941
[45] Date of Patent: Jul. 25, 2000

[54] PHOTONIC SILICON ON A TRANSPARENT SUBSTRATE

[75] Inventors: Stephen D. Russell, San Diego; Wadad B. Dubbelday, Spring Valley; Randy L. Shimabukuro, San Diego; Paul R. de la Houssaye, San Diego; Diane M. Szaflarski, San Diego, all of Calif.

[73] Assignee: The United States of America as represented by the Secretary of the Navy, Washington, D.C.

[21] Appl. No.: 08/118,900

[22] Filed: Sep. 9, 1993

[51] Int. Cl.[7] ...................... H01L 33/00; H01L 31/0312; H01L 27/15; H01L 31/12
[52] U.S. Cl. ............................... 257/103; 257/77; 257/79
[58] Field of Search ................... 257/79, 103, 77

[56] References Cited

U.S. PATENT DOCUMENTS

| | | | |
|---|---|---|---|
| 4,767,517 | 8/1988 | Hiraki et al. | 204/192.25 |
| 5,144,390 | 9/1992 | Matloubian | 357/23.7 |
| 5,281,830 | 1/1994 | Kotaki et al. | 257/86 |
| 5,281,831 | 1/1994 | Uemoto et al. | 257/102 |
| 5,298,767 | 3/1994 | Shor et al. | 257/77 |
| 5,324,965 | 6/1994 | Tompsett et al. | 257/103 |
| 5,331,180 | 7/1994 | Yamada et al. | 257/3 |
| 5,347,147 | 9/1994 | Jones | 257/77 |
| 5,438,241 | 8/1995 | Zavracky et al. | 315/169.3 |
| 5,531,184 | 7/1996 | Muranaka et al. | 117/108 |

OTHER PUBLICATIONS

Brandt, M.S., et al., *Solid State Commun.*, 80, 1992, 307.
Campbell, J.C., et al, *Appl. Phys. Lett*, 60, 1992, 889.
Canham, L.T. *Appl. Phys. Lett.*, 57, 1990, 1046.
Cullis, A.G. & L.T. Canham, *Nature*, 353, 1991, 335.
Doan, V. V., & M. J. SAilor, *Appl. Phys. Lett.*, 60, 1992, 619.
Doan, V.V., & M.L. Sailor, *Science*, 265, 1992, 1791.
Fathauer, R.W., et al., *Appl. Phys. Lett.*, 60, 1992, 995.
Ghandi, S.K., *VLSI Fabrication Principles*, Wiley, New York, 1983.
Halimaoui, A., et al., *Appl. Phys. Lett.*, 59, 1991, 304.
Koshida, N., & H. Koyama, *Appl. Phys. Lett.*, 60, 1992, 347.
Lehmann, V., & U. Gosele, *Appl. Phys. Lett.*, 58, 1990, 856.
Richter: A., et al., *IEEE Electron Device Letters*, 12, 1991, 691.
Sarathy, J., et al., *Appl. Phys. Lett.*, 60, 1992, 1532.
Shih, S., et al., *Appl. Phys. Lett.*, 60, 1992, 833.
Sze, S.M., *Physics of Semiconductor Devices* (2nd ed.), Wiley, New York, 1981.
Vasquez, R.P., *Appl. Phys. Lett.*, 60, 1992, 1004.
Zheng, X.L., et al., *Appl. Phys. Lett.*, 60, 1992, 986.
Bsiesy, et al, *Surf Sci.*, vol. 254, 1991, p. 195*. A copy of this reference is not currently available to us. It will be provided when available.

*Primary Examiner*—Ngân V. Ngô

[57] ABSTRACT

A light emitting photonic structure has a transparent substrate, such as sapphire, supporting a layer of group IV semiconductor material, such as silicon, having at least one porous region from which light is emitted as a response to an electrical or optical stimulus. Optionally, the group IV semiconductor material may be germanium, carbon, tin, silicon-germanium, silicon carbide, single crystal structures, polycrystalline structures, or amorphous structures and the transparent substrate may be glass, quartz, fused silica, diamond, ruby, yttria alumina garnet, yttria stabilized zirconium, magnesium fluoride or magnesium oxide. When the stimulus is electrical, the response is electroluminescence or cathodoluminescence and when the stimulus is optical, the response is photoluminescence. The method includes providing a transparent substrate, forming a layer of a group IV semiconductor material on the transparent substrate, and fabricating at least one region in the layer of the group IV semiconductor material from which light is emitted as a response to a electro- or photo-stimulus. The fabricating of the region is by a photochemical etch by an etching solution and a means to catalyze an etching reaction and may further include an illuminating of the region with light or an other suitable wavelength to provide for a photo-initiated photo-chemical stain etch of the region.

12 Claims, 1 Drawing Sheet

PHOTONIC SILICON ON A TRANSPARENT SUBSTRATE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The band structure for single crystal silicon exhibits a conduction band minimum which does not have the same crystal momentum as the valence band maximum yielding an indirect gap, see S. M. Sze, *Physics of Semiconductor Devices,* 2nd ed., John Wiley, New York, 1981, p. 13. Therefore, in silicon, radiative recombination can only take place with the assistance of a phonon source of light, unlike group III–V semiconductors which have a direct gap at the center of the Brillouin zone. The discovery of photoluminescence in porous silicon has therefore generated a now optoelectronic material for study, note, for example, the articles by L. T. Canham, *Appl. Phys. Lett.,* vol. 57, 1990, p. 1046; by V. Lehmann and U. Gosele, *Appl. Phys. Lett.,* vol. 58, 1990, p. 856: by A. Bsiesy et al., *Surf. Sci.,* vol. 254, 1991, p. 195; by A. Richter et al., *IEEE Electron Device Letters,* vol. 12, 1991, p. 691; by A. G. Cullis and L. T. Canham, *Nature,* vol. 353, 1991, p. 335. by V. V. Doan and M. J. Sailor, *Science,* vol. 265, 1992, p. 1791; by J. C. Campbell et al., *Appl. Phys. Lett,* vol. 60, 1992, p. 889: by V. V. Doan and M. J. Sailor, *Appl. Phys. Lett.,* vol. 60, 1992, p. 619; by A. Halimaoui et al., *Appl. Phys. Lett.,* vol. 59, 1991, p. 304; and by N. Koshida and H. Koyama, *Appl. Phys. Lett.,* vol. 60, 1992, p. 347.

FIG. 1 schematically shows a cross-section of a porous silicon layer PS formed on a bulk silicon substrate BSS. The porous layer is typically formed using electrochemical etching as described in the above references to a depth of about 1 to 30 microns into the bulk silicon substrate, which is nominally 500 microns thick. The typical emission spectrum of electrochemically etched porous silicon is in the red, orange and yellow region (nominally 500 to 750 nm) although green and blue emission has also been demonstrated. Blue shift of the peak emission wavelength has been shown by increased oxidation and etching of the porous silicon, see S. Shih et al., *Appl. Phys. Lett.,* vol. 60, 1992, p. 1004.

At this time the light emitting mechanism is not fully understood, with three competing theories existing: quantum size effects, as referred to in Canham, 1990 and Shih et al., 1992 cited above, amorphous silicon radiative emission, as referenced in R. P. Vasquez et al., *Appl. Phys. Lett,* vol. 60, 1992, p. 1004, and surface passivation species allowing molecular radiative emission, see X. L. Zheng et al., *Appl. Phys. Lett.,* vol. 60, 1992, p. 986; and M. S. Brandt et al., *Solid State Comun,* vol. 81, 1992, p. 307. This scientific controversy, however, has not hindered the ability to fabricate porous silicon layers and useful light emitting devices using this technology in bulk silicon.

Thus, in accordance with this inventive concept a need has become apparent for a light emitting (photonic) silicon an a transparent substrate and its method of fabrication which provides improved additional capabilities and also offers compatibility with advanced microelectronic technology.

SUMMARY OF THE INVENTION

The present invention is directed to providing a light emitting (photonic) silicon on a transparent substrate and its method of fabrication. A photonic structure includes a transparent substrate and a layer of group IV semiconductor material formed on the transparent substrate. The layer of the group IV semiconductor material is provided with at least one region from which light is emitted as a response to a stimulus. In the preferred embodiment a region of the layer of the group IV semiconductor material is porous so that it has the property of a lower density with respect to the adjoining layer of the group IV semiconductor material. The group IV semiconductor material is selected from silicon, germanium, carbon, tin, silicon-germanium, silicon carbide, single crystal structures, polycrystalline structures, or amorphous structures. The transparent substrate is chosen from sapphire, glass, quartz, fused silica, diamond, ruby, yttria alumina garnet, yttria stabilized zirconium, magnesium fluoride or magnesium oxide. The stimulus may be electrical in nature and the response is electroluminescence, the stimulus may be electrical in nature and the response is cathodoluminescence or the stimulus may be optical in nature and the response is photoluminescence.

The method for forming a photonic structure on a transparent substrate includes the providing of a transparent substrate, the forming of a layer of a group IV semiconductor material on the transparent substrate, and the fabricating of at least one region in the layer of the group IV semiconductor material from which light is emitted as a response to a stimulus. The forming of the layer in the group IV semiconductor material may include the fabrication of at least one semiconductor or an optical device and an interconnected semiconductor device device therein. The fabricating of at least one region in the layer in the group IV semiconductor material from which light is emitted is by the utilizing of a photochemical etch thereon which may include the applying of an etching solution and a means to catalyze an etching reaction. The method may further include an illuminating of the region in the layer of the group IV semiconductor material with light or an other suitable wavelength to provide for a photo-initiated photo-chemical stain etch of the region of the layer in the group IV semiconductor material.

An object of the invention is to provide a luminescent porous silicon produced for a transparent substrate.

An object of the invention is to provide a luminescent porous silicon produced for thin silicon films of less than 10 microns in thickness using an electrochemical etch, a chemical stain etch or a photochemical etch of silicon on a transparent material.

An object of the invention is to provide a luminescent porous silicon produced for thin silicon films of less than 10 microns in thickness using an electrochemical etch, a chemical stain etch or a photochemical etch of SOS.

Another object is to provide a fabrication of thin film luminescent porous silicon-on-sapphire (SOS) which allows the elimination of interactions with and contribution from a bulk silicon substrate by etching the entire silicon layer.

Another object is to provide a luminescent porous silicon-on-sapphire that aids in the definition of the porous layer in forming a well-defined interface therebetween.

Yet another object of the invention is to provide a luminescent porous silicon for thin silicon films that are compatible with standard electrochemical fabrication of porous silicon.

Another object is to provide a fabrication of light emitting (photonic) silicon on SOS having a compatibility with advanced microelectronic technology and, for example, large-scale integrated circuitry.

Another object is to provide a light-emitting (photonic) silicon on a transparent substrate with integrated microelectronics having advantages over bulk silicon, such as, high speed, radiation hardness, high temperature and cryogenic temperature operation, and various other applications.

Another object is to provide a luminescent porous silicon-on-sapphire having intrinsically lower parasitic capacitance and improved device isolation.

Still another object is to provide a luminescent porous silicon-on-sapphire capable or being thinned to yield vertically scaled dimensions facilitating horizontal scaling of submicron devices.

Yet another object is to provide a luminescent porous silicon-on-sapphire substrate offering excellent dielectric isolation, improved thermal conductivity, improved transparency, rigidity, flatness, hardness and resistance to chemicals.

Another object is to provide photonic silicon on a transparent substrate to improve electro-optic integration and flat panel display technology.

Another object is to provide thin film photonic silicon on a sapphire substrate to enable the separation of diagnostic signals from the underlying bulk materials and to allow for focus on the luminescing layer.

Another object In to provide photonic silicon on a transparent substrate to permit excitation and detection of photoluminescence through the transparent substrate.

Another object is to provide thin film photonic silicon on a sapphire substrate to permit excitation and detection or photoluminescence through the transparent sapphire substrate.

An object of this invention is to provide a means for assuring a detection of emitted light below and within a substrate.

An object of the invention is to provide a light emitting source in which a photoexcitation source can be implemented above or below the substrate.

Another object is to provide extremely thin films (25 Angstroms and thicker) or light emitting silicon capable of being fabricated with any conceivable area and remain mechanically supporting).

Another object is to provide opaque electrodes such as aluminum, titanium and platinum silicides, tungsten and the like which may be used in a light emitting device application.

Another object is to provide a light emitting semiconductor having a photonic silicon on a transparent substrate in which the silicon layer is amenable to a variety of fabrication techniques including electrochemical etching, photochemical etching, photoelectrochemical etching, chemical stain etching or lithographic patterning and etching that may include plasma, reactive ion etching, laser etching and the like.

Another object is to provide a light emitting photonic silicon on a transparent substrate structure having nanostructures in the form of nanowires that way be lithographically fabricated laterally rather than vertically, thereby making them more rugged and easier to make electrical contact as well as providing for the creation of a vertical nanostructures.

These and other objects of the invention will become more readily apparent from the ensuing specification when taken in conjunction with the appended claims.

DESCRIPTION OF THE PREFERRED EMBODIMENT

The emergence of light emitting (photonic) porous silicon has made apparent some of the limitations inherent in the fabrication of the porous silicon in bulk silicon as opposed to thin film forms. Fabrication of photonic porous silicon on a transparent substrate in accordance with this inventive concept offers numerous unique device geometries previously unattainable on the opaque bulk silicon substrate including the ability for the emitted light to propagate through the substrate as well as permitting excitation of photoluminescence through the transparent substrate. An appropriate geometry fabricated in accordance with this inventive concept is advantageous in optical cross-bar switches, optical communications, solid state pumping, light emitting diodes and lasers, and related applications.

Figure 1:
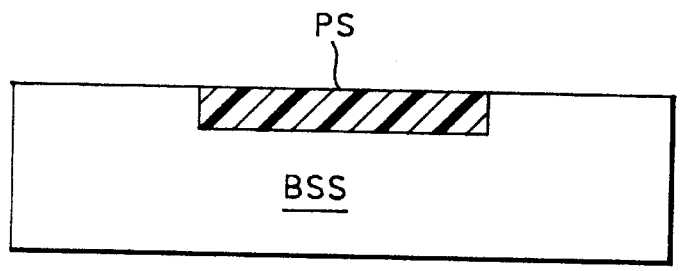
FIG. 1 is an isometric depiction of a prior art cross-section of porous silicon on a bulk silicon substrate.
Figure 2:
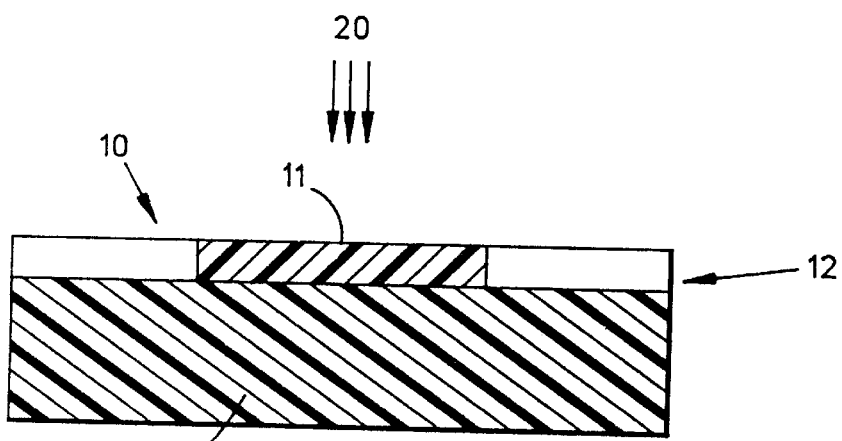
FIG. 2 is a schematic cross-section of an embodiment of this inventive concept.

Referring now to the cross-sectional view of FIG. 2 of the drawings, a silicon-on-sapphire (SOS) substrate 10 has a light emitting (photonic) silicon layer region 11 in silicon layer 12 on a sapphire substrate 13 which has been suitably modified in accordance with this inventive concept to emit light while undergoing photonic or electronic stimulation from an external source 20. A photonic stimulation source is schematically depicted for photoluminescence, it being understood that suitable electrodes or other appropriate means would be suitably disposed to assure a responsive electronic stimulation for electroluminescence or appropriate means could be provided for cathodoluminescence.

Additional insulating, semi-insulating or conducting layers may be added to the light emitting photonic silicon layer on the sapphire substrate in accordance with the particular job at hand, as will become readily apparent to one skilled in the art to which this invention pertains.

Light emitting porous region 11 is generally termed porous in nature due to its decrease in density. This decrease in density is attributed to fabrication techniques associated with the region that are in accordance with this inventive concept as described hereinbelow.

Porous silicon is commonly fabricated by anodic oxidation of bulk silicon in hydrofluoric acid (HF) solutions (i.e. electrochemical etching). A solution of equal parts of HF and ethanol typically is used in a conventional electrochemical cell with a platinum cathode and the bulk silicon forming the anode. Current densities from about 1 to 100 mA are passed through the solution causing dissolution of the silicon, and the creation of a physically porous structure with a reduction in density. This technique can be used to fabricate thick porous silicon films on bulk silicon where it is straightforward to apply electrical contact to the backside of the porous silicon-bulk silicon wafer. A consequence of this structure, however, is that it is difficult to readily integrate this structure with associated electronic control circuitry such as digital logic, shift registers, row and column drivers for display, high voltage sources and memory chips which would otherwise eliminate interactions with other components. In addition, the use of the bulk silicon substrate compromises high speed, radiation hardening, higher operating temperatures, cryogenic temperature operation and other demanding applications. Furthermore, intolerable parasitic capacitances are created and isolation of related devices are compromised by using bulk silicon. Other limitations of using bulk silicon is that the opaqueness of the structure of bulk silicon prevents emitted light from passing through the substrate (it can only be radiated away from the porous silicon on the bulk substrate and not through the bulk substrate) and the bulk silicon substrate prevents a photo-excitation of the porous layer through the opaque bulk silicon layer. This opaqueness alone limits the flexibility to which a porous silicon-bulk silicon substrate structure can be utilized.

The fabrication techniques for thick porous silicon films on bulk silicon, as outlined above, are less valuable in the fabrication of porous silicon films on a transparent substrate, such as sapphire or silicon on sapphire (SOS), for example, due to the electrical insulation (typically>$10^6$ Ω-cm resistivity) of the transparent substrate.

In accordance with this inventive concept another requirement has become apparent which is the obtaining of highly uniform porous regions for the more demanding device applications that require fabrication techniques which are more compatible with conventional VLSI processing. In accordance with this inventive concept the first photochemical fabrication of porous silicon on both a transparent and an opaque substrate is demonstrated, as well as the use of chemical stain etching to produce porous silicon on a transparent substrate requiring no electrical current. The chemical stain technique has been reported in the literature, see J. Sarathy et al., *Appl. Phys. Lett.*, vol. 60, 1992, p. 1532: and R. W. Fathauer et al., *Appl. Phys. Lett.*, vol. 60, 1992, p. 995.

Fabrication of the porous silicon layer on a transparent substrate in accordance with this inventive concept relied on a chemical stain etch using a solution of $HF:HNO_3$:deionized $H_2O$ typically in the ratio of (1:5:10). Both bulk silicon and transparent substrate wafers such as SOS can be similarly processed using this inventive method. The transparent substrate SOS samples were epitaxially deposited silicon, boron doped in-situ to $4 \times 10^{15}$ cm$^{-3}$, on 270 nm-thick SOS ($1 \times 10^{18}$ cm$^{-3}$) to a total silicon thickness of 10 μm. The etch solutions were prepared by reacting a square centimeter of silicon with the $HF:HNO_3$ mixture for 2 minutes causing an accumulation of $HNO_2$, the active oxidizer in the reaction, see S. K. Chandi, *VLSI Fabrication Principles*, Wiley, New York, 1983, pp. 478–482. The chemical etch is a result of hole injection from the $HNO_3$ oxidant into the silicon substrate via the following net reaction:

$$Si+HNO_3+6\ HF \rightarrow H_2SiF_6+HNO_2+H_2O+H_2.$$

The reaction is catalyzed by the presence of $NO_2$ ions, and so there is usually an induction period observed for the etching process. Deionized $H_2O$ was subsequently added to the solution prior to immersion of the sample to be etched. Typical etch times ranged from 1 to 15 minutes. The samples were rinsed with deionized water, dried with nitrogen and examined with a hand held ultra-violet (UV) lamp (Mineralight Model #S52). Generally, samples etched for less than 1 minute did not luminesce, whereas SOS samples that are etched longer than ~15 minutes result in complete dissolution of the silicon off the sapphire substrate.

Another fabrication process for creating photonic porous silicon on a transparent or opaque substrate claimed herein relies on the demonstration of a photo-initiated chemical stain etch. The n-type SOS samples were epitaxially deposited silicon, phosphorous doped in-situ ($10^{15}$ cm$^{-3}$), on 270 nm thick SOS ($^{75}$As doped to $10^{18}$ cm$^{-3}$) to a total silicon thickness of 10 μm used for demonstration purposes. The acid mixture of $HF:HNO_3$ was diluted with distilled $H_2O$ (same ratios as above) and placed in optical quality cuvettes. The samples were immersed in solution and illuminated for 2–10 minutes using a 5 mW HeNe laser. For short times, typically one minute, etching occurs only in the regions where the sample is illuminated. Patterns generated by double slit diffraction produced distinguishable etched features on the order of 30 μm with both the bulk and SOS material. As the illumination time increases, the etching spreads out to regions of the silicon which were not illuminated and small etched features become washed out consistent with the generation of holes required for the catalysis of the etching mechanism described above. After rinsing with deionized $H_2O$ and drying with nitrogen, the samples display visible orange photoluminescence upon UV illumination. The porous silicon layer thickness is found using SEM to be ~300 nm for samples irradiated for 8 minutes. It must be noted that the addition of the transparent substrate increases the ability to couple light into the silicon to initiate the etching from the backside by acting as a partial antireflective coating. In this case, the refractive indices of silicon, sapphire and the etching solution are nominally 3.882, 1.765 and 1.34, respectively. The amount of light reflected from the solution-silicon interface is 24% whereas the amount of light loss to reflection through the solution-sapphire and sapphire-silicon interfaces totals about 16%. Similar optical coatings using, for example, silicon nitride may also be employed to control the light intensity yet withstand the chemistry for the formation of porous silicon.

The photoluminescence spectra of a number of etched samples were monitored using a defocused (5 mW/cm$^2$) 442 nm HeCd laser for excitation. The photoluminescence spectra emissions of photonic silicon on transparent substrate samples were collected by a 0.25 m monochrometer with a CCD detector. The collection spot size was on the order of 1 mm in diameter. The porous photonic silicon on a transparent substrate, in this case porous SOS, shows photoluminescence signals comparable to those published for porous p-type bulk silicon.

Figure 3:
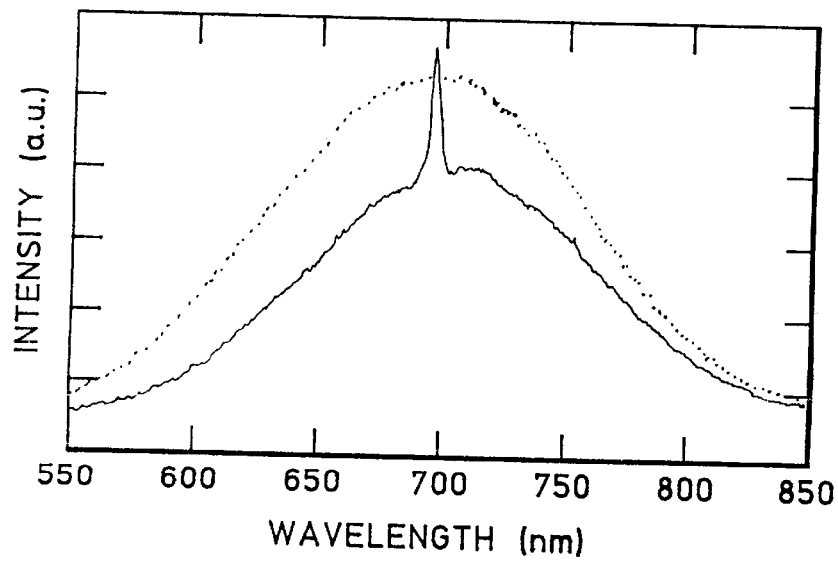
FIG. 3 depicts the photoluminescence spectra of porous silicon-on-sapphire.

The photoluminescence spectra of 10 μm thick SOS etched for 9 minutes art shown in FIG. 3. The two curves shown are the emission spectra obtained when the sample is illuminated and emission collected at the silicon side (dotted line) and at the sapphire side (solid line) of the wafer. The photoluminescence maximizes in intensity at ~700 nm with a linewidth (FWHM) of ~100 nm. The luminescence from the $Cr^{+3}$ impurity (695 nm) is pronounced in the sapphire side illumination spectrum. The similarity in the front and backside spectra suggests uniformity in the porous structure with depth, and that strain effects due to the lattice mismatch between the silicon and the sapphire are minimal.

Fabricating porous SOS allows for the accurate control of the depth of the porous layer. Etching completely through the silicon layer to the silicon-sapphire interface allows control of the porous layer thickness by controlling the thickness of the silicon. The latter is controlled via either deposition techniques or oxidation/etch thinning processes which are well established VLSI techniques. Fabrication procedures on 0.3 μm-thick and 10 μm-thick SOS showed no significant difference in the photoluminescence characteristics of peak emission wavelength or linewidth. The thicker porous layer did exhibit an increased luminescence intensity relative to the thinner porous layer which is attributed to the volumetric increase in number of silicon emitters.

Luminescent porous silicon can be produced for thin silicon films, even well below one micron in thickness, using either a chemical stain etch or a photochemical etch of SOS material. For device applications, porous films of 10 microns and thinner are desireable. Note, silicon layers of 25 Angstroms and tricker can readily be fabricated on sapphire. The fabrication of thin film porous SOS allows the elimination of interactions with and contribution from the bulk by etching the entire silicon layer. This aids in the definition of the porous layer and the forming of a wall defined interface. Note that the photochemical etch described above and the chemical stain etch are etching techniques that are more compatible with the standard microelectronic device fabrication but do not rule out the use of the electrochemical fabrication of porous silicon on a transparent substrate.

The fabrication of light emitting (photonic) silicon on SOS offers compatibility with advanced microelectronic technology (NMOS, PMOS and CMOS). In addition, SOS is a proven technology for large-scale integrated circuitry. It has several distinct advantages over bulk silicon for high speed, radiation hardened, high temperature, cryogenic temperature and other various applications. In electronic circuits SOS has intrinsically lower parasitic capacitances and provides better device isolation. It can be thinned to yield vertically scaled dimensions facilitating horizontal scaling of submicron devices. The use of the sapphire substrate offers: excellent dielectric isolation, thermal conductivity, transparency, rigidity, flatness, hardness, and resistance to chemicals.

Although the foregoing description discussed the embodiment of silicon-on-sapphire, this inventive concept also includes the ability to deposit acid crystallize (if desired) silicon on a variety of transparent substrates to permit a variety of light emitting silicon structures including but not limited to substrate materials: sapphire, glass, quartz, fused silica, magnesium oxide, magnesium fluoride, diamond, yttria stabilized zirconium (YSZ), ruby (chromium doped sapphire ($Cr:Al_2O_3$)), yttria alumina garnet (YAG) and others. In addition, the silicon may have various degrees of crystallinity ranging from single crystal defect-free material, to highly disordered nearly amorphous or amorphous silicon. Variations in silicon film thickness, appropriate patterning or doping of the silicon will also be readily apparent to one skilled in the art to which this invention pertains from the teachings disclosed within. In addition, whereas the use of the semiconductor material silicon for the porous layer has been described above it is to be understood that other group IV semiconductor materials could be selected from the group consisting of silicon, germanium, carbon, tin, and group IV semiconductor alloys and compounds such as silicon-germanium alloys, silicon carbide and the like as will be apparent to one skilled in the art to which this invention pertains.

Variations of existing stain etches (times, solution compositions, etc.) can also be readily modified to accommodate variations in silicon thicknesses, crystallinity and substrate properties as well as the other materials as will be apparent to one skilled in the art to which this invention pertains. Electrochemical etches may be employed with contact to a suitable conductive buried layer placed between the upper portion of the silicon layer and the transparent substrate. Techniques to form such a conductive buried layer include apitaxial deposition techniques, diffusion doping, ion implantation and annealing and other related semiconductor processing techniques practiced in the art. Photochemical etches may utilize either frontside or backside illumination, or a combination of both. Similarly, variation in incident wavelength, intensity and location of illumination may be suitably chosen for the job at hand and with the materials selected. Photochemical etching is particularly suited to localized (laterally or vertically) formation of porous light-emitting structures.

The thin film nature associated with the preferred embodiment also provides a means for accurate control of a third dimension not associated with the prior art. As such, lithographic definition using e-beam or x-ray lithography can produce lateral structures (quantum wires) which are inherently more manufacturable than vertical pillar structures and more readily contacted to for device applications.

A structure fabricated in accordance with this inventive concept of photonic silicon on a transparent substrate allow the emitted light to be detected from above, below and within the substrate. The photoexcitation source can be implemented above or below the substrate and while light has been referred to as the wavelengths of the stimulation, it is envisioned within the scope of this inventive concept that other wavelengths within the electromagnetic spectrum might be appropriate for fabricating some porous materials. Extremely thin films (25 angstroms and thicker) of light-emitting silicon can be fabricated with any conceivable area and remain mechanically supportive. Opaque electrodes (e.g. aluminum, titanium and platinum silicides, tungsten and the like) may be used in device applications. This feature is important since is the prior art of porous silicon devices on bulk silicon uses semitransparent electrodes made of gold, or transparent electrodes made of indium tin oxide (ITO) which are not commonly used in conventional silicon microelectronics. Gold forms a mid-bandgap state in silicon. Contamination with gold slows down high speed electronics, and is more expensive than traditional metals. ITO is more complicated to fabricate and pattern (and therefore more expensive) and not commonly available in high quality deposited films which is required for high yield on large numbers of integrated devices. The silicon layer is amenable to a variety of fabrication techniques including electrochemical etching, photochemical etching, photo-electrochemical etching, chemical stain etching or lithographic patterning and etching (plasma, reactive ion etching, laser etching). Furthermore, nanostructures (nanowires) may be lithographically fabricated laterally rather than vertically, thereby making them more rugged and easier to make electrical contact. Vertical nanostructures can also be fabricated. A host of transparent substrates could be used. The thickness of the light-emitting region can be controlled by the thickness of the starting silicon layer and need not be controlled by the chemical processing, if desired.

More advantages of a porous silicon-on-sapphire in accordance with this inventive concept, are that sapphire is mechanically strong, chemically inert and resistant to acid, has a broad transmission window (from the UV to the IR), can be polished extremely smooth and flat, and in an excellent electrical insulator. These properties allow uniform, thin films of porous silicon to be fabricated. Photonic silicon devices fabricated in accordance with this inventive concept may be readily integrated with associated electronic control circuitry, such as digital logic, shift registers, row and column drivers for displays, high voltage sources, memory chips and the like which have been demonstrated in SOS. This substrate easily allows for the monolithic integration of photonic and electronic devices. SOS is also amenable to the fabrication of optical waveguides to optically connect photonic sources.

Obviously, many modifications and variations of the present invention are possible in the light or the above teachings. It is therefore to be understood that within the scope of the appended claims the invention may be practiced otherwise than as specifically described.

We claim:

1. A photonic structure comprising:
   a transparent substrate; and
   a layer of group IV semiconductor material formed on said transparent substrate having a region for emitting light wherein said region is porous and has a lower density than that of a portion of said layer outside said region.

2. The photonic structure of claim 1 wherein said group IV semiconductor material is at least one of silicon, germanium, carbon, and tin.

3. The photonic structure of claim 1 wherein said group IV semiconductor material is at least one of group IV semiconductor alloys silicon-germanium and silicon carbide.

4. The photonic structure of claim 1 wherein said group IV semiconductor is at least one of single crystal strictures, polycrystalline structures, and amorphous structures.

5. The photonic structure of claim 1 wherein said transparent substrate is sapphire.

6. The photonic structure of claim 1 wherein said transparent substrate is at least one of glass, quartz, fused silica, diamond, ruby, yttria alumina garnet, yttria stabilized zirconium, chromium doped sapphire, magnesium fluoride, and magnesium oxide.

7. The photonic structure of claim 1 further comprising an electrical stimulus operably coupled to said region for generating electroluminescence.

8. The photonic structure of claim 1 further comprising an electrical stimulus operably coupled to said region for generating cathodoluminescence.

9. The photonic structure of claim 1 further comprising an optical stimulus operably coupled to said region for generating photoluminescence.

10. The photonic structure of claim 1 further comprising a semiconductor device formed in said group IV semiconductor material.

11. The photonic structure of claim 1 further comprising an optical device formed in said group IV semiconductor material.

12. The photonic structure of claim 1 further comprising an optical device and a semiconductor device operable coupled to said region.

* * * * *